United States Patent [19]
Polinski, Sr.

[11] Patent Number: 4,899,118
[45] Date of Patent: Feb. 6, 1990

[54] LOW TEMPERATURE COFIRED CERAMIC PACKAGES FOR MICROWAVE AND MILLIMETER WAVE GALLIUM ARSENIDE INTEGRATED CIRCUITS

[75] Inventor: Paul W. Polinski, Sr., Dana Point, Calif.

[73] Assignee: Hughes Aircraft Company, Los Angeles, Calif.

[21] Appl. No.: 289,862

[22] Filed: Dec. 27, 1988

[51] Int. Cl.$^4$ .............................................. H01P 5/00
[52] U.S. Cl. .................................. 333/246; 333/247; 361/414
[58] Field of Search ...................... 333/238, 246, 247; 361/414

[56] References Cited

U.S. PATENT DOCUMENTS

| | | | |
|---|---|---|---|
| 4,574,255 | 3/1986 | Fujii et al. | 361/414 X |
| 4,672,152 | 6/1987 | Shinohara et al. | 361/414 X |
| 4,724,283 | 2/1988 | Shimada et al. | 361/414 X |

OTHER PUBLICATIONS

"Next-Generation High-Speed Packaging", Gary Holz, Jan. 1988, pp. 32–40.
"Development of a Low Temperature Cofired Multilayer Ceramic Technology", William A. Vitriol et al, 1983 ISHM Proceedings, pp. 593–598.
"Electronic Packaging Using Low Temperature Co-Fireable Ceramics", A. L. Eustice et al, Jun. 1987, Hybrid Circuit Technology, pp. 9–14.
"A New Low Temperature Fireable Ag Multilayer Ceramic Substrate Having Post-Fired Cu Conductor" (LFC-2), S. Nishigaki et al, 1986 ISHM Proceedings, pp. 429–444.
"Low Firing Temperature Multilayer Glass-Ceramic Substrate", Y. Shimada et al, Proceedings 33rd Electronic Components Conference (1983), pp. 314–319.
"Co-Fired Ceramic Multilayers: When Reliability Counts", R. Keeler, Electronic Packaging and Production, May 1987, pp. 40–42.
"Processing and Reliability of Resistors Incorporated Within Low Temperature Cofired Ceramic Structures", R. Pond et al, 1983, ISHM Proceedings, pp. 461–472.
"Low Temperature Co-Fireable Ceramics with Co-Fired Resistors", H. T. Sawhill et al, 1986 ISHM Proceedings, pp. 268–271.

*Primary Examiner*—Paul Gensler
*Attorney, Agent, or Firm*—Terje Gudmestad; Wanda Denson-Low

[57] ABSTRACT

A low temperature cofired monolithic ceramic package (10) for use with microwave and millimeter wave gallium arsenide integrated circuits, or the like. In situ buried passive components (28), including capacitors, resistors, couplers and inductors are incorporated within a cofired substrate structure (12). Fields of interconnected staggered or stacked vias (56, 58) are provided in the substrate below the integrated circuit for efficient heat transfer and electrical connection to a ground plane that eliminates complicated heat sink strucutres. At least one cavity (24) is provided in the top surface to confine integrated circuit chips. A plurality of connectable electrical conductors (34,36,38,40,42) including RF input and output leads and DC bias leads for the chip extend from the edge of the substrate (12) to the edge of the cavity (24). A sidewall 14 is extends around the periphery of the cavity (42) and comprises a low temperature cofired structure which is cofired with the substrate (12). The sidewall 14 has a metalized top surface and interconnected metalization and vias extending from the top surface to the top surface layer of the substrate (12). A cover (16) is provided which is attachable to the metalized top surface (44) of the sidewall (14). The electrical and thermal interconnections provided in the sidewall (14) and substrate (12) are provided by means of the plurality of interconnected staggered or stacked via interconnects. Electrical and thermal integrity is achieved which permits dissipation of heat by way of the ground plane and top cover, and electrial shielding is achieved by interconnecting the conductive components.

15 Claims, 1 Drawing Sheet

LOW TEMPERATURE COFIRED CERAMIC PACKAGES FOR MICROWAVE AND MILLIMETER WAVE GALLIUM ARSENIDE INTEGRATED CIRCUITS

BACKGROUND OF THE INVENTION

The present invention relates generally to hybrid microcircuit packaging, and more particularly to a low temperature cofired ceramic package for use with microwave and millimeter wave gallium arsenide integrated circuits, and the like.

The current state of the art in packaging microwave and millimeter wave gallium arsenide integrated circuits involves inherently complex structures designed to meet radio frequency, thermal and reliability requirements of microwave products. These packages are expensive and are typically assemblies of piece parts. Typical of these assemblies are packages which employ (1) metal bases and sidewalls with glassed in feedthroughs, (2) metal or ceramic bases with metal sidewalls and brazed ceramic feedthroughs, (3) ceramic bases with epoxied ceramic covers, or (4) metal bases with glassed on ceramic covers. An article entitled "Next-Generation High-Speed Packaging," by Gary Holz, published in Microwave Systems News, in the January, 1988 issue examines some considerations in package design for high speed applications.

Currently available packaging schemes are generally complicated structures which employ a combination of ceramics, metals, glasses, solders, mixed thin and thick film technologies with complicated input and output leads structures. Much of the expense of such conventional packages is related to multiple-step, labor-intensive assembly procedures. Radio frequency (RF) performance is also degraded in most conventional packaging designs due to discrete elements, such as resistors, capacitors, couplers and matching networks, and the like, added to the package.

In conventional packaging schemes, semiconductors, passive components and microwave integrated circuit chips, including gallium arsenide chips, are attached to substrates or metal portions with conductive adhesives, or the like. Although some high power chips are eutectic mounted for thermal performance, alternate techniques are often used because of the difficulty of eutectic die attachment which often damages the thin, brittle gallium arsenide integrated circuits.

Metal box type assemblies are generally tightly packed with individual substrates and passive chip components that are mounted with either conductive or nonconductive adhesives and interconnected with bonded gold wires or ribbons. It has been determined that manufacturing yields for such assemblies are low due to the incorporation of electrically faulty chips, or to mechanical problems encountered in manual assembly of numerous small components and fine wires in a precision assembly. RF and DC hermetic feedthroughs in these metal-walled enclosures are generally soldered, brazed, or glass sealed coaxial assemblies. Although currently available infrared tunnel oven and induction curing methods have been successful in manufacturing such assemblies, electrical feedthroughs employed therein are prone to insulator damage, and connection rework frequently damages other costly components. Rework is frequently a progressively degrading process, as one repair may require removal of, or cause damage to, previously operational parts.

The development and use of low temperature cofireable ceramics has been discussed in the literature over the past 4–5 years. See, for example, "Development of a Low Temperature Cofired Multilayer Ceramic Technology," by William A., Vitriol et al, 1983 ISHM Proceedings, pages 593–598, "Electronic Packaging Using Low Temperature Co-Firable Ceramics," by A. L. Eustice et al, Hybrid Circuit Technology, pages 9–14, June 1987, "A New Low Temperature Fireable Ag Multilayer Ceramic Substrate Having Post-fired Cu Conductor (LFC-2)," by S. Nishigaki et al, 1986 ISHM Proceedings, pages 429–449, "Low Firing Temperature Multilayer Glass-Ceramic Substrate," by Y. Shimada et al, Proceedings 33rd electronic components Conference, (1983), pages 314–319, and "Co-fired Ceramic Multilayers: When Reliability Counts," by R. Keeler, Electronic Packaging and Production, May 1987, pages 40–42. The low temperature cofireable ceramic technology provides the advantages of fine conductor and via geometries and fewer processing steps compared to comparable thick film multilayer technology, which has the advantages of low resistivity conductor materials and resistor material compatibility.

SUMMARY OF THE INVENTION

In view of the problems illustrated hereinabove, the present invention provides for an improved hybrid microcircuit package in the form of a low temperature cofired ceramic package. The monolithic structure of the low temperature cofired package reduces the complexity and cost of such packages. In situ passive components, including capacitors, resistors, couplers, transformers and inductors are incorporated within the structure of the monolithic package. Cofired ceramic technology is employed which combines a substrate and sidewall into one cohesive until Furthermore fields of thermal and electrical metallized vias are provided and processed below a gallium arsenide integrated circuit disposed within the package for efficient heat transfer and electrical connection that eliminates complicated heat sink base structures.

In addition, firing of the materials employed in the package is performed at temperatures under 1000 degrees Celsius, and therefore low resistivity, reliable conductors may be employed. Also buried passive components may be fired within the substrate thereby conserving top level space. In addition, low shrinkage and tight shrinkage control of the low temperature cofired structures permits cofiring of the top level conductor without creating assembly alignment problems.

In particular, the present invention provides for a hybrid package, and in particular a monolithic microwave and millimeter wave hybrid microcircuit package, which comprises a substrate, a sidewall, and a cover for the enclosure formed by the substrate and sidewall. The substrate generally comprises a metal ground plane onto which is disposed a low temperature cofired plurality of ceramic layers. Each ceramic layer has a predetermined pattern of interconnect matalization disposed on one surface thereof and a plurality of metalized vias extending therethrough which interconnect to the interconnect metalization of an adjacent cofired layer. A pattern of interconnect metalization and vias extends from the ground plane through the plurality of ceramic layers to the top surface layer of the substrate to provide thermal and electrical interconnection to the ground plane. A cavity is disposed in the top surface of the substrate which is suitable for confining microwave and millimeter wave integrated circuit, such that a chip is connectable to the interconnect metalization. A plurality of connectable electrical leads extends from the edge of the substrate to the edge of the cavity or from within the substrate to the edge of the cavity and/or to the edge of the substrate. These leads include radio frequency (RF) input and output leads and DC bias leads for the integrated circuit.

The sidewall is disposed on top of the substrate and extends around the periphery of the cavity. The sidewall comprises a low temperature cofired plurality of ceramic layers which are cofired with the substrate. The sidewall has a metalized top surface and which include interconnected metalization and vias extending from the metallized top surface through the plurality of ceramic layers to the top surface layer of the substrate. This provides for electrical interconnection to selected interconnect metalization thereon. The metalized top surface is generally deposited by coating with a suitable metal on top of the sidewall after it is cofired with the substrate. Typical processes for coating the metalized surface include sputtering or vacuum deposition processes. A metal or other suitable cover is also provided with is weldable to the metallized top surface of the sidewall. Typically the metal cover is soldered to the metalized top surface of the sidewall. Alternatively, the cover may be comprised of a metalized ceramic layer, such as Kovar, which is solder sealed to the metalized top surface of the sidewall. In addition, in order to provide for a fully shielded structure, a thin metal layer may be deposited on the exposed surface of the sidewall and substrate by means of a sputtering process, or other coating process.

In some situations, the metalized and shielded structure provided above is not required, in which case, the metal top cover and metalized top surface of the sidewall are not required. In such cases, the top cover may be comprised of ceramic which is epoxy bonded to the top surface of the sidewall.

The electrical and thermal interconnections provided in the sidewall and substrate are provided by means of a plurality of staggered or stacked via interconnects between the ceramic layers along with interconnect metalization which interconnects sets of staggered vias. In this manner, thermal integrity is achieved which permits dissipation of heat by way of the ground plane and top cover. Also, electrical shielding is also achieved by grounding the metal surface components together.

The integrated circuit, which is typically a thin, brittle gallium arsenide chip, is epoxy or eutectic mounted in the cavity, which ensures a well defined location for it. In addition, the electrical leads which extend from the outer edge of the substrate to the edge of the cavity are conveniently located adjacent to the chip locations to which they are to be attached. Such attachment is conveniently made by wire bonds or ribbon bonds, such as by tape automated bonding, or other such attachment technique.

The present invention thus achieves a monolithic package for microwave and millimeter wave circuits which has substantially all of the passive components buried within the cofired ceramic layers. As such, assembly time has been eliminated for these components. The present invention thus provides for a means of reliably packaging gallium arsenide integrated circuits employed in microwave and millimeter wave microcircuit structures without significant degradation of circuit performance.

BRIEF DESCRIPTION OF THE DRAWING

The various features and advantages of the present invention may be more readily understood with reference to the following detailed description taken in conjunction with the accompanying drawing, wherein like reference numerals designate like structural elements, and in which:

FIG. 2 illustrates buried passive components and conductive interconnects employed within the cofired substrate of FIG. 1a.

DETAILED DESCRIPTION

Figure 1A:
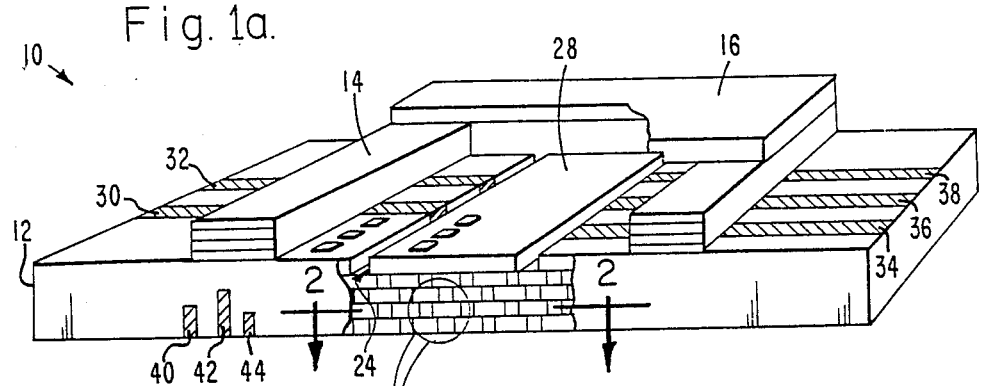
FIG. 1a is an illustration of a low temperature cofired ceramic package for use with microwave and millimeter wave gallium arsenide integrated circuits in accordance with the principles of the present invention.

Referring to FIG. 1a, a three dimensional illustration of a low temperature cofired ceramic package 10 for use with microwave and millimeter wave gallium arsenide integrated circuits in accordance with the principles of the present invention is shown. The package 10 is comprised of a substrate 12, a sidewall 14 and a cover 16.

The substrate 12 may be comprised of a ground plane (not shown) disposed at the bottom thereof, which my be copper, gold, or any other conducting material compatible with the materials and processes described hereinbelow. A plurality of ceramic layers are cofired with the ground plane 20 to form a unitized substrate 12 of the package 10. The cofired ceramic layers are fired using a low temperature cofiring process wherein a plurality of green thick film tape layers are punched with via holes, the via holes are filled with conductive via fill material. Conductor metalization patterns are deposited on the individual tape layers by means of a silk screen process, for example, and materials which form passive components are deposited on the tape layers. The tape layers are laminated and fired at a temperature below 1000 degrees Celsium (typically 850 degrees Celsium) for a predetermined length of time which drives off organic materials contained in the green ceramic tape and forms a solid ceramic substrate 12.

Figure 2:
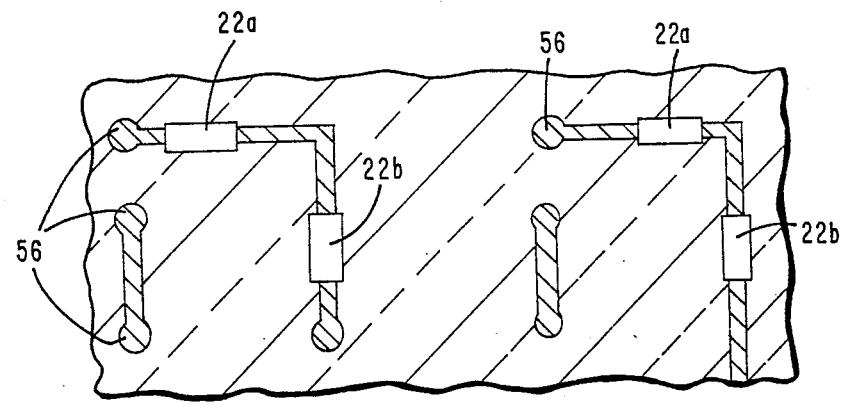

During the formation process, passive components, such as resistors 22a, capacitors 22b, inductors, and the like, may be formed on the surfaces of the layers of the green ceramic tape prior to lamination and firing. Such passive components are shown in more detail in FIG. 2. By appropriately designing the layout of the package 10, substantially all of the passive components may be buried between the tape layers of the substrate 12 and when fired are encapsulated within the substrate 12. The above-outlined procedure yields a monolithic substrate 12 which is highly durable, and which requires minimal electrical component processing in later stages of fabrication.

The low temperature cofiring process and the processing of passive components outlined above is generally well-known in the art, and reference is made to articles entitled "Development of a Low Temperature Cofired Multilayer Ceramic Technology," by William a., Vitriol et al, 1983 ISHM Proceedings, pages 593–598, "Processing and Reliability of Resistors Incorporated Within Low Temperature Cofired Ceramic Structures," by Ramona G. Pond et al, 1986 ISHM Proceedings, pages 461–472, and "Low Temperature Co-Fireable Ceramics with Co-Fired Resistors," by H. T. Sawhill et al, 1986 ISHM Proceedings, pages 268–271.

DC bias and radio frequency (RF) input and output conductors may be provided in several ways. Shown in FIG. 1a are RF input and output conductors 30, 32 and DC bias conductors 34, 36, 38, 40, 42, 44. The RF input and output conductors 30, 32 are generally disposed on the top surface of the substrate 12. These RF conductors 30, 32 comprise 50 ohm through wall transitions, which will e explained in more detail hereinbelow. The 50 ohm conductors 30, 32 are impedance matched to the 50 ohm coaxial connectors used to interface to external signal sources and to the input impedance required by an integrated circuit chip 28, or chips, disposed within the package 10.

As is illustrated in FIG. 1a, DC bias conductors 34, 36, 38 may be disposed on the top surface of the substrate 12 in generally the same manner as the RF conductors 30, 32, but excluding the 50 ohm transition portion. DC bias conductors 40, 42, 44 may also be disposed on a side surface of the substrate 12 which wrap around to an intermediate ceramic layer, or continue to the bottom side of the package 10 with cutouts in the ground plane 20 for electrical isolation as is also illustrated in FIG. 1a. In the former case, the surface conductors are formed by metalizing the top surface of the top-most green tape layer prior to firing. In the latter case, the conductor trace is formed as part of the metalization process for the green tape and it is interconnected to one of the buried passive components such as 22a or 22b or signal input lines shown in FIG. 2, as the circuit design requires.

A cavity 24 is formed in the top surface of the substrate 12 by appropriately punching a window in a plurality of tape layers prior to firing, for example. This cavity 24 is employed to house the integrated circuit chip 28, which may be epoxy or eutectic bonded into the cavity 24. Although not shown, other cavities may be formed in the substrate 12 to house other components, such as transformers, chip capacitors or diodes, or the like. RF isolation between channels in a multiple channel package may be accomplished by mounting active and passible devices in cavities that have metalized sidewalls which are located at different levels in the substrate 12, for example.

The sidewall 14 is also comprised of a plurality of cofired ceramic layers and these layers are cofired on top of the previously cofired substrate 12. A conductor metalization layer may be formed on the top surface of the sidewall 14. This conductor metalization layer may be employed as a seal ring to solder seal a subsequently applied metal or metalized ceramic cover 16 which electrically and hermetically seals and shields the package 10.

The sidewall 14 is disposed around the periphery of the cavity 24 that holds the integrated circuit chip 28. The cofiring process completely seals the interface between the substrate 12 and the sidewall 14. The through-wall conductor transitions formed by RF and DC bias conductors 30, 32, 34, 36, 38 are thus hermetically sealed by the cofiring process and are not subject to potential leakage problems.

Figure 1B:
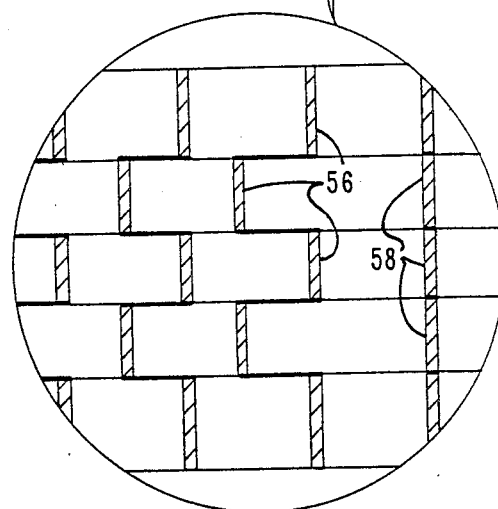
FIG. 1b is an enlarged view of a portion of the cofired substrate of the ceramic package of FIG. 1a illustrating the staggered via pattern employed therein.

With reference to FIG. 1b, a cross sectional view of the substrate 12 is shown. FIG. 1b shows a pattern of staggered vias 56 and stacked vias 58 which are employed in both the substrate 12 and the sidewall 14 to permit heat transfer from the integrated circuit chip 28, electrical grounding of the chip 28 to the ground plane, and electrical interconnection of the cover 16 to the ground plane for shielding purposes. The staggered and stacked vias 56, 58 are interconnected by conductor metalization paths formed during the printing process prior to cofiring the tape layers. These staggered and stacked vias 56, 58 provide for thermal and electrical integrity of the package 10 while maintaining hermeticity thereof.

As should be apparent from the above, the present invention provides for a monolithic integrated circuit package 10 which has a minimum of components, including one or more discrete components, namely the integrated circuit chip or chips. Consequently, assembly time and other labor intensive procedures are lessened when compared to conventional packages.

Thus there has been described a new and improved a low temperature cofired ceramic package for use with microwave and millimeter wave gallium arsenide integrated circuits, or the like. The monolithic structure of the low temperature cofired package reduces the complexity and cost of such packages. In situ passive components are incorporated within the structure of the monolithic package. Furthermore, fields of thermal and electrical metallized vias are provided and processed below the integrated circuit to provide for efficient heat transfer and electrical connection that eliminates complicated heat sink base structures. Fields of thermal and electrical metallized vias are incorporated in the sidewall to provide for electrical connection of the metal or metal clad structures forming the package to electrically shield the package.

It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A monolithic microwave and millimeter wave hybrid microcircuit package comprising:
   a substrate comprising:
   (a) a metal ground plane:
   (b) a low temperature cofired plurality of stacked ceramic layers disposed on the ground plane, each ceramic layer having a predetermined pattern of interconnect metallization disposed thereon and a plurality of metallized vias extending therethrough which interconnect to the interconnect metallization of adjacent cofired layers;
   (c) a pattern of interconnect metallization and vias extending from the ground plane through the plurality of ceramic layers to a top surface layer thereof to provide thermal and electrical interconnection to the ground plane; and
   (e) a cavity disposed in the top surface suitable for confining microwave and millimeter wave integrated circuit chips, such that a chip is connectable to the interconnect metallization;

a plurality of connectable electrical leads extending from the edge of the package substrate to the edge of the cavity;

a sidewall disposed on the top of the substrate and extending around the periphery of the cavity, and comprising a low temperature cofired plurality of ceramic layers which are cofired with the cofired ceramic layers of the substrate, the sidewall having a metallized top surface and having interconnected metallization and vias extending from the metallized top surface through the plurality of ceramic layers to the top surface layer of the substrate to provide electrical interconnection to selected interconnect metalization thereon; and a metal cover attachable to the metallized top surface of the sidewall.

2. The monolithic microwave and millimeter wave ceramic hybrid microcircuit package of claim 1 wherein said substrate further comprises:

selected passive components disposed within the substrate; and a pattern of interconnect metallization and vias extending from the top surface of the substrate to the selected passive components disposed within the substrate to provide for interconnection thereto.

3. The monolithic microwave and millimeter wave ceramic hybrid microcircuit package of claim 1 wherein said plurality of connectable electrical leads extending from an edge of the substrate to the edge of the cavity comprises:

a plurality of connectable electrical leads disposed on the top surface of the substrate and extending from the edge of the package substrate to the edge of the cavity; and a plurality of connectable radio frequency input and output leads disposed on the top surface of the substrate and extending from the edge of the substrate to the edge of the cavity.

4. The monolithic microwave and millimeter wave ceramic hybrid microcircuit package of claim 1 wherein said plurality of connectable electrical leads extending from an edge of the substrate to the edge of the cavity comprises:

a plurality of connectable electrical leads disposed between selected cofired layers of the substrate and extending from the edge of the substrate to the edge of the cavity; and a plurality of connectable radio frequency input and output leads disposed on the top surface of the substrate and extending from the edge of the substrate to the edge of the cavity.

5. The monolithic microwave and millimeter wave ceramic hybrid microcircuit package of claim 1 wherein said plurality of connectable electrical leads extending from an edge of the substrate to the edge of the cavity comprises:

a plurality of connectable electrical leads disposed between selected cofired layers of the substrate and extending from the edge of the substrate to the edge of the cavity; and a plurality of connectable radio frequency input and output leads disposed between selected cofired layers of the substrate and extending from the edge of the substrate to the edge of the cavity.

6. The monolithic microwave and millimeter wave ceramic hybrid microcircuit package of claim 1 wherein said pattern of interconnect metalization comprises a pattern of staggered or stacked vias interconnected by interconnect metalization.

7. The monolithic microwave and millimeter wave ceramic hybrid microcircuit package of claim 1 which further comprises:

conductive metalization deposited on the external surface of the substrate and sidewall.

8. The monolithic microwave and millimeter wave ceramic hybrid microcircuit package of claim 7 wherein the conductive metalization is deposited by means of a predetermined coating process.

9. The monolithic microwave and millimeter wave ceramic hybrid microcircuit package of claim 7 wherein the coating process comprises a sputtering process.

10. The monolithic microwave and millimeter wave ceramic hybrid microcircuit package of claim 8 wherein the coating process comprises a vacuum deposition process.

11. A monolithic microwave and millimeter wave hybrid microcircuit package comprising:

a substrate comprising:
(a) a ground plane:
(b) a low temperature cofired plurality of stacked ceramic layers disposed on the ground plane, each ceramic layer having a predetermined pattern of interconnect metallization disposed thereon and a plurality of metallized vias extending therethrough which interconnect to the interconnect metallization of adjacent cofired layers, selected ones of the plurality of ceramic layers having selected passive components disposed thereon and interconnected to selected interconnect metallization;
(c) a pattern of interconnect metallization and vias extending from the ground plane through the plurality of ceramic layers to a top surface layer thereof to provide thermal and electrical interconnection to the ground plane;
(d) a pattern of interconnect metallization and vias extending from the top surface to the passive components disposed between the ceramic layers to provide for interconnection thereto; and
(e) at least one cavity disposed in the top surface suitable for confining microwave and millimeter wave integrated circuit chips, such that a chip is connectable to the interconnect metallization; a plurality of connectable electrical leads extending from an edge of the substrate to the edge of the cavity; a plurality of connectable radio frequency input and output leads extending from an edge of the substrate to the edge of the cavity; a sidewall disposed on top of the package substrate and extending around the periphery of the cavity, and comprising low temperature cofired plurality of ceramic layers which are cofired with the cofired ceramic layers of the substrate, the sidewall having metallized top surface and having interconnected metallization and vias extending from the metallized top surface through the plurality of ceramic layers to the top surface layer of the substrate to provide electrical interconnection to selected interconnect metallization thereon; and a cover attachable to the metallized top surface of the sidewall.

12. A monolithic microwave and millimeter wave hybrid microcircuit package comprising:

a low temperature cofired substrate made of a plurality of stacked layers having a metal ground plane and a predetermined number of passive components contained between selected layers of the substrate and having a plurality of interconnected vias extending from the top surface of the substrate to the ground plane to provide thermal and electrical interconnection thereto and a plurality of interconnected vias extending from the top surface of the substrate to each of the passive components for interconnection thereto;

at least one cavity formed in the top surface of the substrate;

bias interconnect metallization disposed on the top surface of the substrate and extending from the outside edge of the substrate to the edge of the cavity;

a plurality of radio frequency input and output conductor metallization disposed on the top surface of the substrate and extending from the outside edge of the substrate to the edge of the cavity;

a low temperature cofired sidewall disposed on the top surface of the substrate surrounding the cavity and having metallized top surface and plurality of interconnected vias interconnecting said top surface metallization to the ground plane;

conductive cover means attached and interconnected to the metallized top surface of the sidewall for enclosing the interior of the package.

13. A hybrid microcircuit package comprising:

a low temperature cofired layered substrate having buried passive components disposed between selected layers of the substrate and having a plurality of interconnected vias extending though the substrate to provide electrical interconnection to each of the buried passive components;

at least one cavity formed in the top surface of the substrate;

a plurality of conductor metallization paths disposed on selected surfaces of the substrate and extending from the outside edge of the substrate to the edge of the cavity;

a low temperature cofired sidewall disposed on the top surface of the substrate surrounding the cavity;

a cover attachable to the top surface of the sidewall for enclosing the package.

14. The hybrid microcircuit package of claim 13 wherein said sidewall further comprises:

a pattern of interconnect metalization and vias extending from the top surface to the substrate to provide for electrical interconnection thereto.

15. The hybrid microcircuit package of claim 13 wherein said plurality of connectable electrical leads comprise:

bias interconnect metalization disposed within the substrate and extending to the top surface of the substrate within the cavity and extending from the outside edge of the cavity to the edge of the substrate;

a plurality of connectable radio frequency input and output leads extending from an edge of the package substrate to the edge of the cavity.

* * * * *

UNITED STATES PATENT AND TRADEMARK OFFICE
CERTIFICATE OF CORRECTION

PATENT NO. : 4,899,118

DATED : February 6, 1990

INVENTOR(S) : Paul W. Polinski, Sr.

It is certified that error appears in the above-identified patent and that said Letters Patent is hereby corrected as shown below:

Column 1, line 32, "thin" instead of "this".

Column 2, line 38, "unit." instead of "until".

Column 3, line 26, "which" instead of "with".

Column 5, line 15, "be" instead of "e".

Column 5, line 49, "passive" instead of "passible".

Signed and Sealed this

Ninth Day of April, 1991

Attest:

HARRY F. MANBECK, JR.

*Attesting Officer*  *Commissioner of Patents and Trademarks*